(12) United States Patent
Yoshikawa

(10) Patent No.: US 8,432,695 B2
(45) Date of Patent: Apr. 30, 2013

(54) COOLING DEVICE

(75) Inventor: Minoru Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 691 days.

(21) Appl. No.: 12/441,811

(22) PCT Filed: Sep. 4, 2007

(86) PCT No.: PCT/JP2007/067557
§ 371 (c)(1),
(2), (4) Date: Aug. 7, 2009

(87) PCT Pub. No.: WO2008/035579
PCT Pub. Date: Mar. 27, 2008

(65) Prior Publication Data
US 2009/0314473 A1    Dec. 24, 2009

(30) Foreign Application Priority Data
Sep. 19, 2006   (JP) .................................. 2006-252177

(51) Int. Cl.
*H05K 7/20* (2006.01)
(52) U.S. Cl.
USPC ...... 361/709; 361/679.47; 361/696; 361/702; 174/260; 165/185
(58) Field of Classification Search .................. 361/678, 361/679.46–679.49, 679.53, 690, 695–699, 361/701–702, 715–716, 719
See application file for complete search history.

(56) References Cited

U.S. PATENT DOCUMENTS

| | | | | |
|---|---|---|---|---|
| 4,621,304 A | * | 11/1986 | Oogaki et al. | 361/720 |
| 5,785,116 A | * | 7/1998 | Wagner | 165/80.3 |
| 5,794,685 A | * | 8/1998 | Dean | 165/121 |
| 6,019,165 A | * | 2/2000 | Batchelder | 165/80.3 |
| 6,028,355 A | * | 2/2000 | Gates | 257/706 |
| 6,747,873 B1 | * | 6/2004 | Searls et al. | 361/695 |
| 7,262,967 B2 | * | 8/2007 | Crocker et al. | 361/699 |
| 7,336,487 B1 | * | 2/2008 | Chrysler et al. | 361/699 |

(Continued)

FOREIGN PATENT DOCUMENTS

| | | |
|---|---|---|
| DE | 203 03 845 U1 | 5/2003 |
| DE | 10 2004 060497 B3 | 1/2006 |

(Continued)

OTHER PUBLICATIONS

International Search Report for PCT/JP2007/067557 mailed Nov. 13, 2007.

(Continued)

*Primary Examiner* — Courtney Smith

(57) ABSTRACT

When the side of a surface of the board on which the device to be cooled is mounted is defined as the upper side while the side of the other surface is defined as the lower side in a substantially vertical direction to the board, a cooling device includes a heat receiving portion arranged on the upper side the device to be cooled for performing heat exchange with the device to be cooled; a columnar portion standing substantially perpendicularly on the board; a base having a through hole which the columnar portion passes through, and arranged on the upper side of the heat receiving portion; and biasing means for biasing the base along the columnar portion to thereby press the heat receiving portion against the device to be cooled.

14 Claims, 11 Drawing Sheets

U.S. PATENT DOCUMENTS

| | | | |
|---|---|---|---|
| 7,477,517 B2 * | 1/2009 | Khanna et al. | 361/704 |
| 7,583,502 B2 * | 9/2009 | Tsao et al. | 361/697 |
| 7,751,918 B2 * | 7/2010 | Campbell et al. | 700/97 |
| 2004/0190251 A1 | 9/2004 | Prasher et al. | |
| 2005/0036292 A1 * | 2/2005 | Chengalva et al. | 361/715 |
| 2005/0145366 A1 * | 7/2005 | Erel | 165/80.3 |
| 2005/0183848 A1 | 8/2005 | Cheng et al. | |
| 2005/0243520 A1 * | 11/2005 | Tomioka et al. | 361/702 |
| 2006/0192293 A1 | 8/2006 | So | |
| 2008/0068797 A1 | 3/2008 | Iikubo | |

FOREIGN PATENT DOCUMENTS

| | | | |
|---|---|---|---|
| JP | 1996153839 A | 6/1996 | |
| JP | 1996255855 A | 10/1996 | |
| JP | 1998294582 A | 11/1998 | |
| JP | 2002093960 A | 3/2002 | |
| JP | 2004235481 A | 8/2004 | |
| JP | 2005175075 A | 6/2005 | |
| JP | 2006100692 A | 4/2006 | |
| JP | 2006190735 A | 7/2006 | |
| JP | 2006237369 A | 9/2006 | |
| JP | 2008072062 A | 3/2008 | |

OTHER PUBLICATIONS

European Communication for EP07 806 989.5 issued Jan. 11, 2012.
Japanese Office Action for JP2008-535318 mailed on Sep. 26, 2012.

* cited by examiner

COOLING DEVICE

This application is the National Phase of PCT/JP2007/067557, filed Sept. 4, 2007, which is based upon and claims the benefit of priority from Japanese Patent Application No. 2006-252177, filed Sept. 19, 2006, the disclosure of which is incorporated herein in its entirety by reference.

TECHNICAL FIELD

The present invention relates to a cooling device for cooling an LSI such as a processor for use in computers, and ICs mounted around the LSI, and particularly relates to a cooling device for cooling an LSI with the use of a liquid coolant.

BACKGROUND ART

The increase in the degree of integration of LSIs used in computers or the like is being accelerated by generation and generation. This accelerated increase in the degree of integration has caused a trend of increase in the amount of generated heat. In order to allow an LSI to operate rapidly and stably, the operating temperature of the LSI must be controlled to ascertain level or lower. Therefore, there is generally used a cooling device according to an amount of heat that the LSI generates.

For example, Japanese Laid-Open Patent Publication No. H08-255855 proposes an air-cooling module structure in which a heat sink is attached on an LSI and a fan is arranged over the heat sink to apply cool air thereto. Additionally, Japanese Laid-Open Patent Publication No. 2006-100692 proposes a liquid-cooling module in which a heat receiving portion, a pump, a radiator, and a reserve tank are disposed above an LSI to circulate liquid.

The air-cooling module structure as described in No. H08-255855 has a problem that it is difficult to cool an LSI generating a large amount of heat. The heat sink is made of a metal such as copper or aluminum having high heat conductivity. Heat generated by the LSI is diffused, by heat conduction, from a contact portion with the heat sink to the whole heat sink, and then discharged to the outside air from fins on the surface of the heat sink. The capacity to conduct the heat from the contact portion with the LSI to the fins drops as the amount of generated heat is increased. In this state, the cooling capacity will not be improved significantly even if the size of the heat sink is increased. Although the cooling capacity may be improved by increasing the rotation speed of the fan, this will cause a problem of noises. In general, when the rotation speed of the fan is doubled, the acoustic pressure will also be increased by 15 to 18 dB.

On the other hand, the liquid-cooling module may solve this problem, but, at the same time, a radiator is additionally required to cool the liquid coolant circulating system including a pump and pipes, as well as the liquid coolant which has received heat from the LSI.

The liquid-cooling module according to Japanese Laid-Open Patent. Publication No. 2006-100692 has a structure, as shown in FIG. 2 of the publication, in which a heat receiving portion, a pump, a reserve tank, and a radiator are stacked on top of an LSI. The projection area occupied by the liquid-cooling module is greater than the LSI packaging area, and hence the board area around the LSI is also covered with the liquid-cooling module. This limits the sizes of other components mountable on the board area around the LSI to be cooled. Components which can be mounted on the covered board area must have a size that is small enough to fit in the gap between the board and the lower surface of the liquid-cooling module. Therefore, only components having a small height can be mounted, or no other components can be mounted around the LSI. Even if there can be provided enough space to mount the components, the space around the components will be so small that the air flow tends to be impeded. This restricts the mounting of heat generators.

Further, the liquid-cooling module according to Japanese Laid-Open Patent Publication No. 2006-100692 has difficulty to maintain stable contact between the LSI and the heat receiving portion, posing a problem in maintaining the cooling efficiency. The liquid-cooling module has a greater number of components and a greater weight than an air-cooling module. This is because the liquid-cooling module includes not only a radiator as an alternative of the heat sink of the air-cooling module but also a heat receiving portion made of copper or the like, a pump, a reserve tank, and liquid coolant, and the weights of these components are added. However, the liquid-cooling module according to Japanese Laid-Open Patent Publication No. 2006-100692 is fixed to the board at its contact portion with the LSI. When the entire apparatus including the liquid-cooling module is moved, the liquid-cooling module having a great weight will oscillate around a fulcrum on the LSI. As a result, the contact between the LSI and the heat receiving portion becomes instable and the cooling efficiency drops. If the oscillation is large, the LSI may be broken. Particularly, when a board is set upright as shown in FIG. 13, moment force will be generated even while the liquid-cooling module is at standstill, and hence the contact portion between the LSI and the heat receiving portion will be constantly subjected to a force that acts to separate the LSI and the heat receiving portion, contributing to deterioration of stability in contact between them and hence deterioration of cooling efficiency.

DISCLOSURE OF THE INVENTION

Problems to be Solved by the Invention

The present invention has been made in view of the above circumstances, and a problem to be solved by present invention is to provide an LSI cooling device which makes it possible to mount another component than the LSI to be cooled, particularly a heat generator on a board area around the LSI.

Another problem to be solved by the present invention is to provide a cooling device which does not restrict the height of a component mounted on a board area around an LSI to be cooled.

Still another problem to be solved by the present invention is to provide a cooling device which can keep the contact pressure between an LSI and a heat receiving portion within a predetermined range even if the whole apparatus including the cooling device moves, or if the board on which the LSI and the cooling device are arranged is set upright.

Means for Solving the Problems

In order to solve the problems above, the present invention provides a cooling device for cooling a device mounted on a board, wherein when the side of a surface of the board on which the device to be cooled is mounted is defined as the upper side while the side of the other surface is defined as the lower side in a substantially vertical direction to the board, the cooling device includes: a heat receiving portion arranged on the upper side the device to be cooled for performing heat exchange with the device to be cooled; a columnar portion standing substantially perpendicularly on the board; a base having a through hole which the columnar portion passes through, and arranged on the upper side of the heat receiving portion; and biasing means for biasing the base along the columnar portion to thereby press the heat receiving portion against the device to be cooled.

Particularly preferably, the heat receiving portion has a structure in which a liquid coolant passes through the inside thereof the cooling device has a group of circulating system devices forming a closed-loop liquid coolant circulating system together with the heat receiving portion, and at least some of the group of circulating system devices are supported to the board by the base and the columnar portion. Any moment force generated by the group of circulating system devices consisting of a pump, a reserve tank, a radiator, a hose, and the like is borne by the base and supporting means, whereby a contact portion between the heat receiving portion and the device to be cooled can be kept stably.

The cooling device may be further provided with a fan for generating air flow and a chassis for supporting the fan above the base such that the air flow is blown down to the board, or sucked up from the board. The generation of air flow to be blown down to or sucked up from the board makes it possible to help cooling of other devices around the device to be cooled.

When the group of circulating system devices is designed to be fixed to the chassis, it can be fixed to the board after integrating the group of circulating system groups with the chassis and the base. This facilitates the assembly and disassembly of the cooling device, and the mounting thereof to the board.

The cooling device may be such that the chassis has a cylindrical shape standing substantially perpendicularly on the base, the base being fixed to its lower opening, and the fan being fixed to is upper opening; the group of circulating system devices includes a radiator, a pump and a reserve tank, the radiator being arranged within the cylinder below the fan, and the pump and the reserve tank being arranged on the inner surfaces of the cylinder below the radiator so as to face each other; a space is formed between the pump and the reserve tank to provide a ventilation path which allows passage of the air flow; and the air flow passes through the radiator and the ventilation path. This configuration is preferable in terms of size reduction of the cooling device.

At least one of the base and the chassis may have a ventilation hole for allowing passage of the air flow, whereby other devices around the device to be cooled also can be cooled efficiently.

The cooling device may be provided with a base-integrated heat receiving portion in place of the heat receiving portion and the base, the base-integrated heat receiving portion having a through hole which the columnar portion passes through, and arranged on the upper side of the device to be cooled to perform heat exchange with the device to be cooled. This makes it possible to increase the size of the heat receiving portion and to enhance the cooling capacity.

The cooling device may be such that a single heat receiving portion may be arranged to face a plurality of devices to be cooled. Alternatively, the cooling device may have the heat receiving portion in plurality, each of the plurality of heat receiving portions being arranged to face at least one device to be cooled.

The devices in the group of closed-loop circulating system devices may be connected to each other by means, of attachable and detachable hoses to form the closed-loop circulating system; and the group of closed-loop circulating system devices may include at least two couplers which are attachable to and detachable from the hoses at the opposite ends thereof. This makes it possible to provide a cooling device which allows addition of a hose and a heat receiving portion by opening between the couplers.

The cooling device may include at least one second heat receiving portion additionally provided to the closed-loop circulating system via the couplers, and the second heat receiving portion may be adhesively bonded to a second device to be cooled by means of a heat conductive adhesive agent. Since there is none of the group of closed-loop circulating system devices other than the heat receiving portion is arranged above the second device to be cooled, moment force generated by the second heat receiving portion will be smaller in comparison when other devices of the group of closed-loop circulating system devices are arranged above the second device to be cooled, even if the second device to be cooled is placed vertically upright, and hence the contact between the second heat receiving portion and the second device to be cooled can be easily maintained stable even if they are fastened with an adhesive agent.

Further, in order to solve the problems described above, the present invention provides a method for arranging, on a board, a cooling device for cooling a device mounted on the board. When the side of a surface of the board on which the device to be cooled is mounted is defined as the upper side while the side of the other surface is defined as the lower side in a substantially vertical direction to the board, the method includes the steps of: arranging a heat receiving portion for performing heat exchange with the device to be cooled so as to face the device to be cooled; arranging a base having a through hole on the upper side of heat receiving portion; and inserting an end of a columnar portion having biasing means fixed to the other end thereof through the through hole to fix the heat receiving portion to the board, whereby the heat receiving portion is pressed against the device to be cooled by the biasing means while the heat receiving portion is supported on the upper side of the board.

The heat receiving portion has a structure in which a liquid coolant passes through the inside thereof, and the method preferably further includes the step of supporting, on the base, the heat receiving portion and a group of circulating system devices forming a closed-loop liquid coolant circulating system together with the heat receiving portion, before arranging the heat receiving portion to face the device to be cooled.

EFFECTS OF THE INVENTION

According to the present invention, the heat receiving portion is pressed against a heat generator with a fixed force by biasing the heat receiving portion with an elastic member such as a spring. Therefore, the heat receiving portion is biased regardless the posture of the device or whether or not external force is applied thereto. This makes it possible to maintain stable contact between them constantly.

Further, means for supporting the weight of the principal part of the liquid-cooling system, including the heat receiving portion, the pump, the reserve tank, the radiator and the fan, is provided in a part other than the contact portion with the heat generator. Therefore, it is possible to prevent any effect due to moment force generated in the principal part from affecting the contact portion between the heat receiving portion and the heat generator.

Still further, since a space is ensured between the base and the board, it is possible to ensure a space for mounting other devices also around the heat generator. Additionally, this space enables convection of the air to prevent the increase in temperature of the other peripheral devices.

BEST MODE FOR CARRYING OUT THE INVENTION

Figure 1:
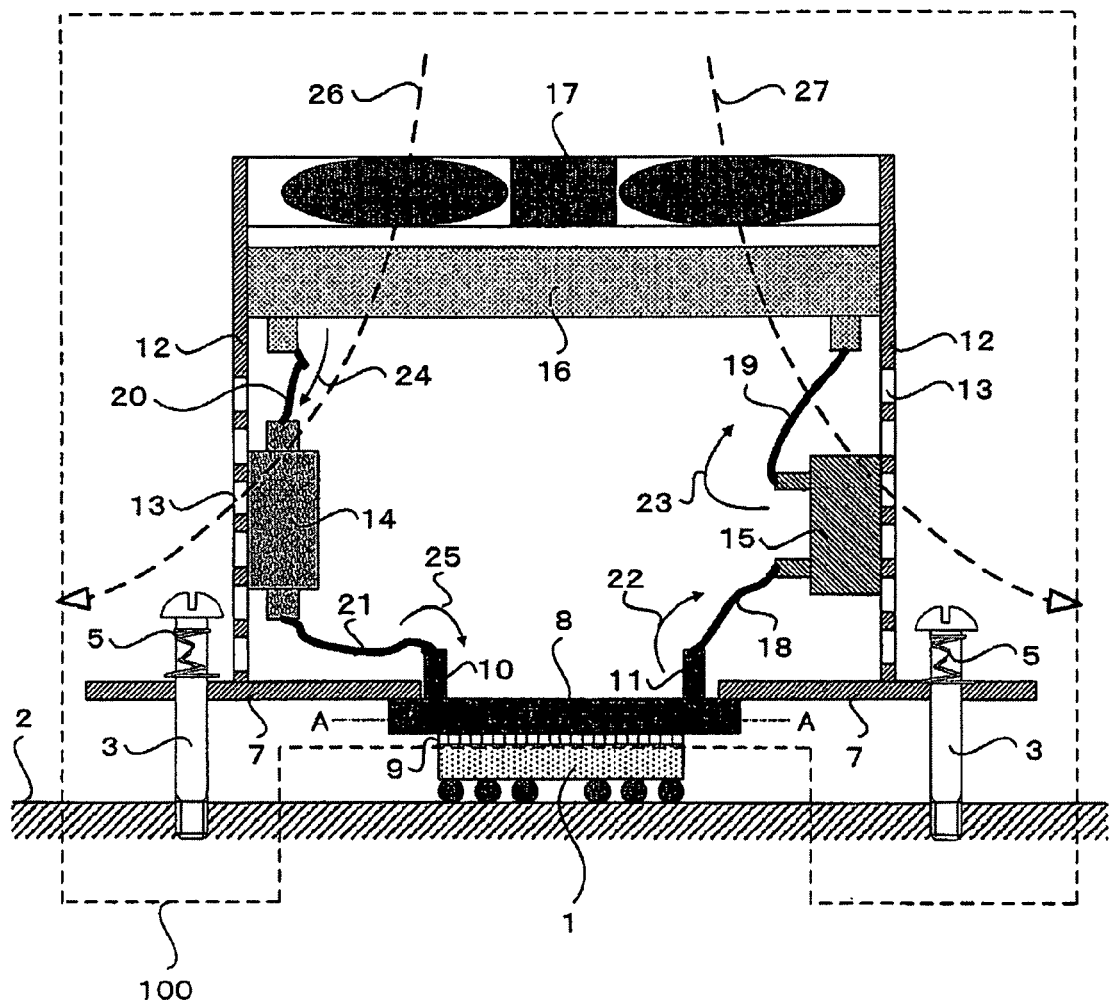
FIG. 1 is a cross-sectional view of a cooling device 100 according to a first embodiment of the present invention.

A cooling device 100 according to a first embodiment of the present invention will be described below with reference to FIG. 1. An LSI 1, which is a device to be cooled, is arranged on a board 2. The principal part of the cooling device 100 is fixed to the board 2 by means of spring loaded screws 3. The spring loaded screws 3 each have a pressing spring 5, by which a force is applied to a base 7 to push the same downward, as viewed in FIG. 1. A heat receiving portion 8 is arranged on the surface of the base 7 facing the LSI 1. The heat receiving portion 8 is made of a metal having high heat conductivity such as copper or aluminum. The force exerted by the pressing spring 5 to press down is transmitted to the heat receiving portion 8 via the base 7. Thus, the force is applied to the heat receiving portion 8 to press the same against the LSI 1.

Figure 2:
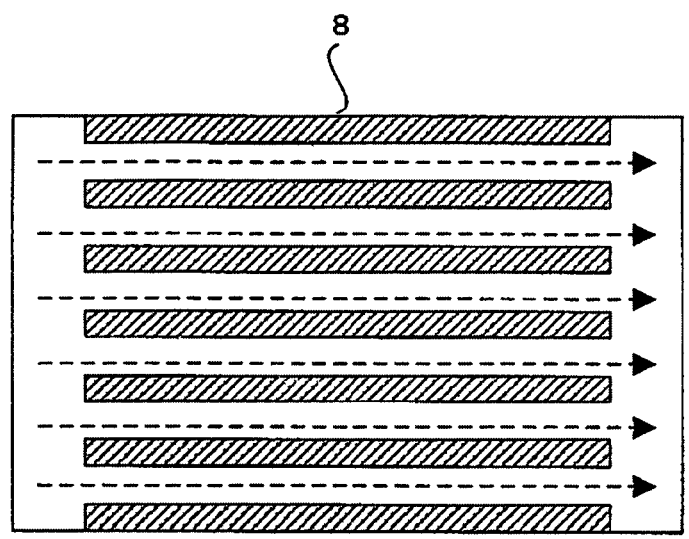
FIG. 2 is an A-A cross-sectional view showing a heat receiving portion 8 of the cooling device 100 shown in FIG. 1.

A heat conductive material 9 such as silicone grease or compound is applied between the LSI 1 and the heat receiving portion 8. Heat generated by the LSI 1 is transferred to the heat receiving portion 8 through the heat conductive material 9. The heat receiving portion 8 receives a liquid coolant such as water through an inlet port 10 and discharges the same through an exit port 11. As shown in the A-A cross-sectional view of the heat receiving portion 8 in FIG. 2, the heat receiving portion 8 has fins in the inside thereof, and transfers the heat received from the LSI 1 to the liquid coolant flowing in the direction as indicated by the arrows in the figure.

Figure 3:
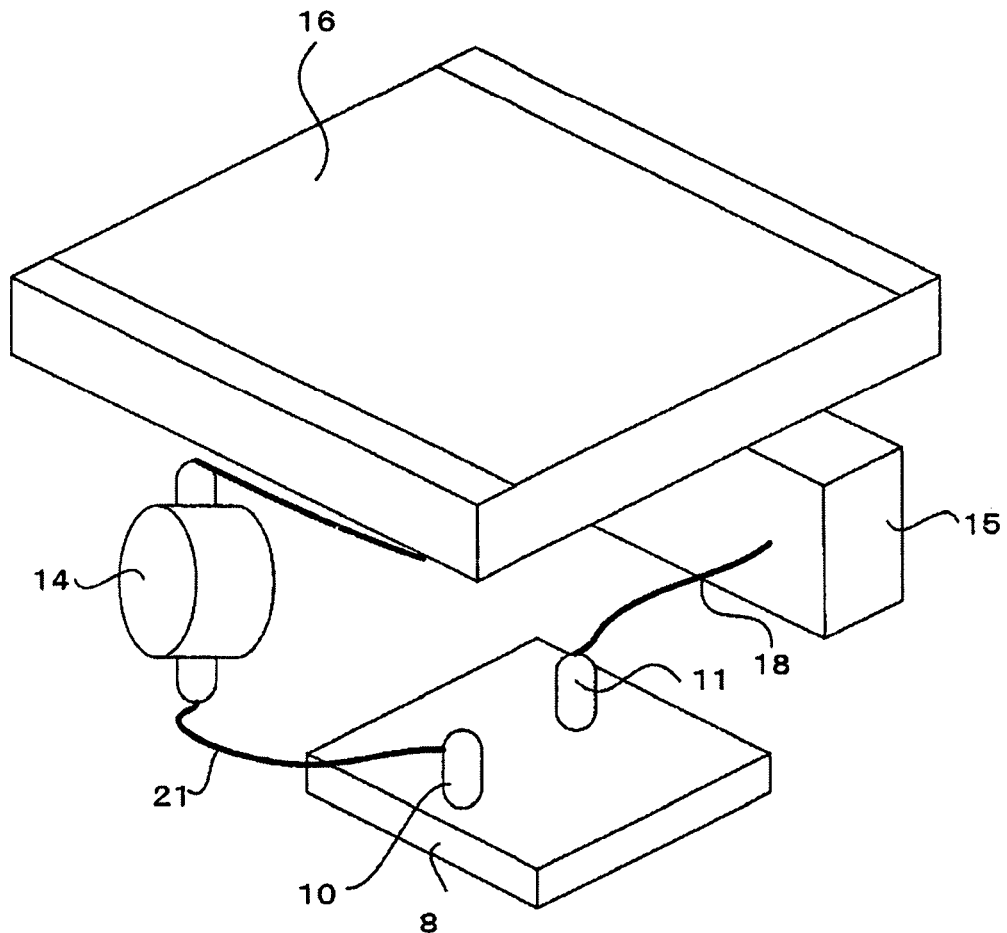
FIG. 3 is a perspective view showing a closed-loop liquid coolant circulating system of the cooling device 100.
Figure 4:
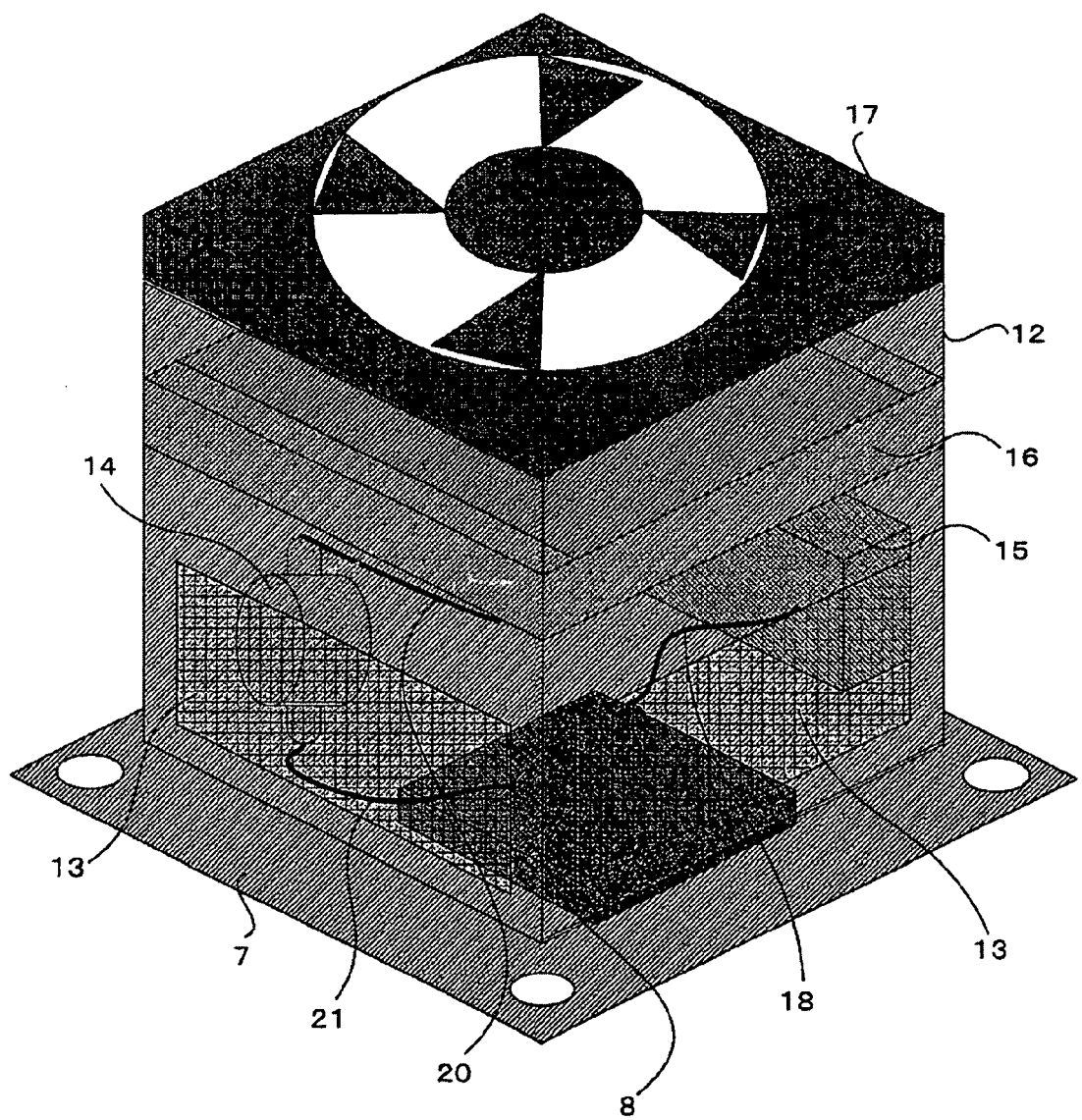
FIG. 4 is an oblique perspective view of the cooling device 100.

A cylindrical chassis 12 having a quadrangular cross section is provided on the base 7. The chassis 12 has four walls and a ventilation hole 13 is formed in one to four of the walls. Additionally, a pump 14 is arranged one of the inner walls of the chassis 12 while a reserve tank 15 is arranged on an inner wall facing thereto. The pump 14 and the reserve tank 15 are fixed to the chassis 12 by means of screws or the like, respectively. A radiator 16 is arranged in an opening of the chassis 12 on the upper side as viewed in the figure. Further, a fan 17 is arranged above the radiator 16. The heat receiving portion 8, the pump 14, the reserve tank 15, and the radiator 16 each have an inlet port and an exit port, and are circularly connected via hoses 18 to 21. A closed-loop liquid coolant circulating system is thus formed, consisting of the heat-receiving portion 8, the pump 14, the reserve tank 15, the radiator 16, and the hoses 18 to 21. The closed-loop circulating system as shown in FIG. 3 is accommodated in the chassis 12 as shown in the perspective view of FIG. 4.

Heat generated by the LSI 1 is transferred to the heat receiving portion 8 via the heat conductive material 9. As indicated by the arrows 22 to 25, the liquid coolant the temperature of which has been increased by taking heat from the heat receiving portion 8 exchanges heat with the air in the radiator 16 to decrease its temperature, and then returns to the heat receiving portion 8 again.

Configurations such as fin pitch, fin thickness, and fin height, and a required flow rate for the heat receiving portion 8 are determined so as to satisfy cooling performance requirements specified in specifications of the LSI 1. The chassis 12 may be fixed to the board 2 after the heat receiving portion 8 is fixed to the chassis 12 in an integral manner. Alternatively, the chassis 10 may be fixed to the board 2 by pressing the same to the heat conductive material 9 and the LSI 1 by means of the pressing springs 5 when fixing the cooling device 100 to the board 2.

The pump 14 gives the liquid coolant a flow velocity in the directions as indicated by the arrows 21 to 25 in the figure. The pump 14 is selected so as to satisfy the pressure loss and the flow rate in the entire closed-loop liquid coolant circulating system.

When the cooling device 100 is operated over a long period of time, the liquid coolant gradually leaks out of the hoses 18 to 21, or out of the joints between the hoses and the heat receiving portion 8, the pump 14, the reserve tank 15 and the radiator 16. The reserve tank 15 is provided for the purpose of storing the liquid coolant in anticipation of such leakage and for the purpose of providing a buffer to prevent the increase of pressure within the circulating system caused by expansion of the liquid coolant due to increase in temperature thereof.

A cross flow type heat exchanger is advantageous as the radiator 16 in terms of performance. For example, corrugated fins are preferred. The radiator 16 is cooled by air blown by the fan 17.

The hoses 18 to 21 are preferably made of butyl or the like from the view point of stability and anti-permeability during long-term service. It is preferable to use a nipple or the like at the joints with the heat receiving portion 8, the pump 14, the reserve tank 15, and the radiator 16 in order to prevent the leakage of the coolant. If the leakage of the coolant can be prevented, the capacity of the reserve tank 15 can be set small, contributing to size reduction of the cooling device 100.

The connection by means of the hoses also provides an advantage to make it easy to replace components and to change the performance range of cooling capacity. For example, even if the amount of generated heat is increased due to upgrade of the LSI 1, this can be addressed only by replacing the pump 14 with a higher-performance pump.

Further, the connection by means of the hoses also makes it easy to change the arrangement of components according to the mounting of the device, resulting improved degree of freedom in mounting. For example, it is conceivable to arrange the pump 14 and the reserve tank 15 on the base 7 to thereby change the dimension in a height or longitudinal direction.

The heat receiving portion 8, the pump 14, the reserve tank 15, the radiator 16, and the fan 17 are fixed to the base 7 and the chassis 12 and are thus integrated together. This makes it easy to carry. Further, the cooling device 100 can be attached to the LSI 1 only by fixing the base 7 to the board 2 by means of the spring loaded screws 3, and thus the cooling device can be easily attached to and detached from the device.

The cooling device 10 is configured such that the pump 14 and the reserve tank 15 attached to the inner walls; of the chassis 12, which makes it possible to secure a ventilation path passing through the inside of the chassis 12. As indicated by the arrows 26 and 27 in the figure, air flow generated by the fan 17 performs heat exchange with the liquid coolant flowing through the radiator 16 to take heat from the same, then passes through the ventilation path, and flows out from the ventilation hole 13. This air flow is blown down to the board 2 from the above, and is capable of cooling other integrated circuits or electronic components such as a cache memory not shown in the figure, disposed on the board 2 outside of the base 7. This makes it possible to mount heat generators such as an IC around the LSI 1 as well, and hence the packaging density of the device can be improved. If the temperature of the air flow after the heat exchange in the radiator 16 is too high to cool the peripheral devices, the direction of rotation of the fan 17 may be reversed to generate air flow in opposite directions relative to the directions indicated by the arrows 26 and 27. In this case, the air flow will first cool the peripheral devices and then perform heat exchange in the radiator 16.

The chassis 12 is attached to the base 7. The base 7 is formed having flanges projecting inward and outward of the chassis 12. The inside flange has a function to press the heat receiving portion 8 against the LSI 1. The outside flange has through holes. The spring-loaded screws 3 and 4 are inserted through these through holes and screwed into threaded holes formed in the board 2. Thus, the heat receiving portion 8 is pressed against the LSI 1 and, at the same time, the base 7 is fixed to the board 2. The board 2 may be formed with through holes instead of the threaded holes, so that the board 2 is fixed by means of a mechanism such as nuts arranged on the rear surface of the board. The board 2 may be fixed by means of clips or the like instead of the screws. A spring load of the pressing springs 5 is determined based on specifications such as withstand load of the LSI 1 and contact resistance of the heat conductive material 9. Further, a stroke length is determined based on a spring constant and an amount of compression satisfying the spring load thus determined.

According to the first embodiment described above, a space is ensured between the board 2 and the base 7 even in the vicinity of the LSI 1, which makes it possible to mount other electronic components (not shown) in the vicinity of the LSI 1 on the board 2. An indirect cooling effect can be obtained around these other electronic components not only by the space ensured between the board 2 and the base 7 but also by the air flow generated by the fan 17.

Figure 5:
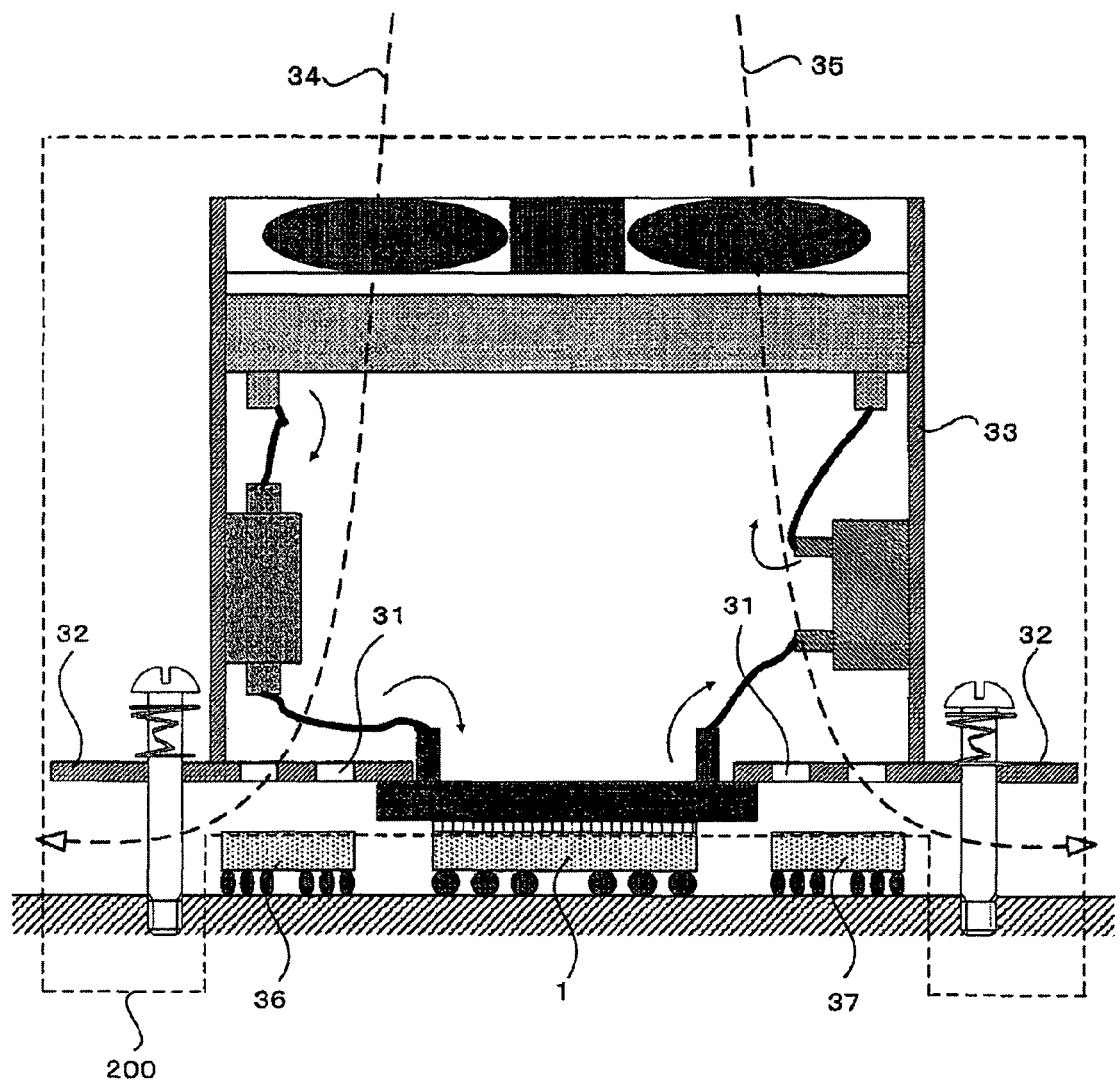
FIG. 5 is a cross-sectional view of a cooling device 200 according to a second embodiment of the present invention.

Next, a cooling device 200 according to a second embodiment of the present invention will be described with reference to FIG. 5. Like components to those of the first embodiment are assigned with the same reference numerals. Comparing with the cooling device 100 described above, the cooling device 200 is different in that a base 32 having ventilation holes 31 is used in place of the base 7, and a chassis 33 having no ventilation hole is used in place of the chassis 12 having the ventilation holes 13.

In the cooling device 200, as indicated by arrows 34 and 35, air flow generated by the fan 17 passes through the radiator 16, a ventilation path passing through the chassis 33 vertically as viewed in the figure, and the ventilation holes 31, hits on electronic components 36 and 37, passes through the space between the board 2 and the chassis 33, and then flows out of the cooling device 200.

Therefore, according to this embodiment, heat generators like the electronic components 36 and 37 can be mounted even in the vicinity of the LSI 1.

Figure 6:
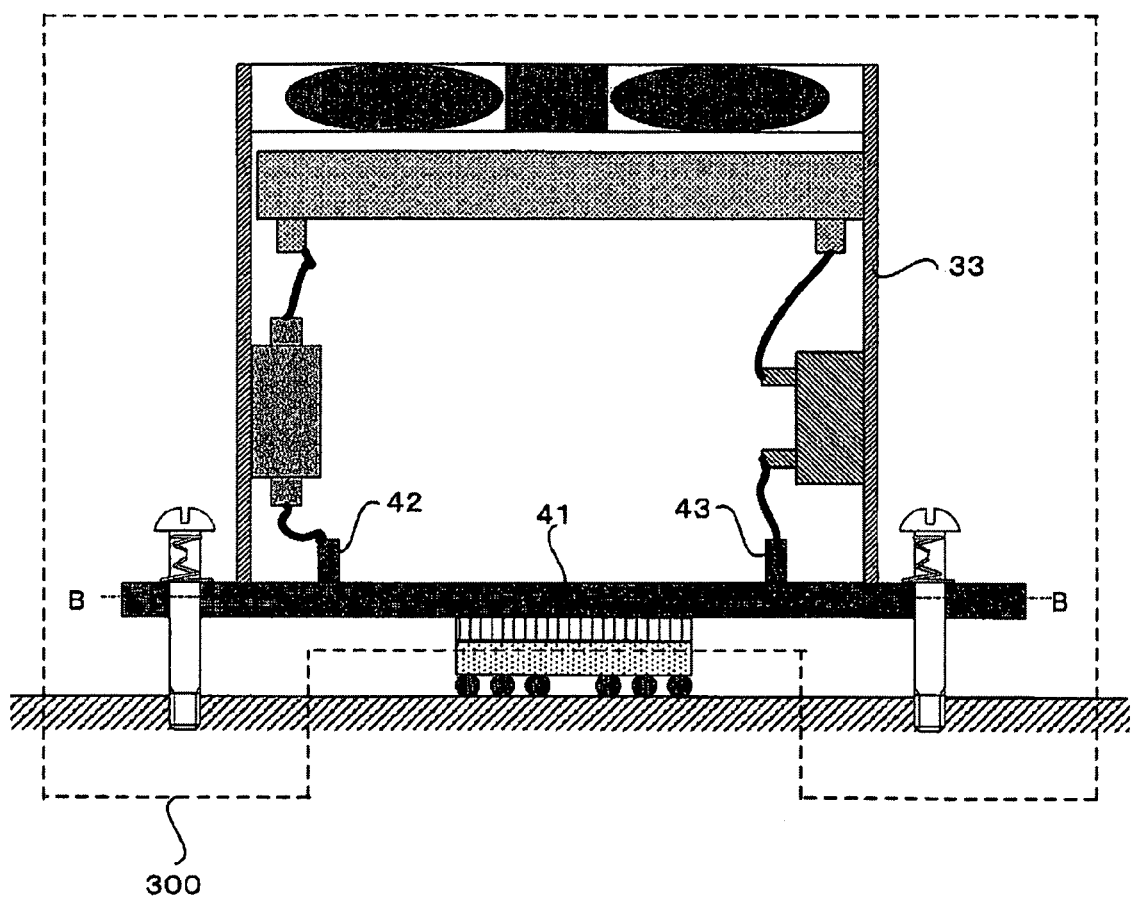
FIG. 6 is a cross-sectional view of a cooling device 300 according to a third embodiment of the present invention.
Figure 7:
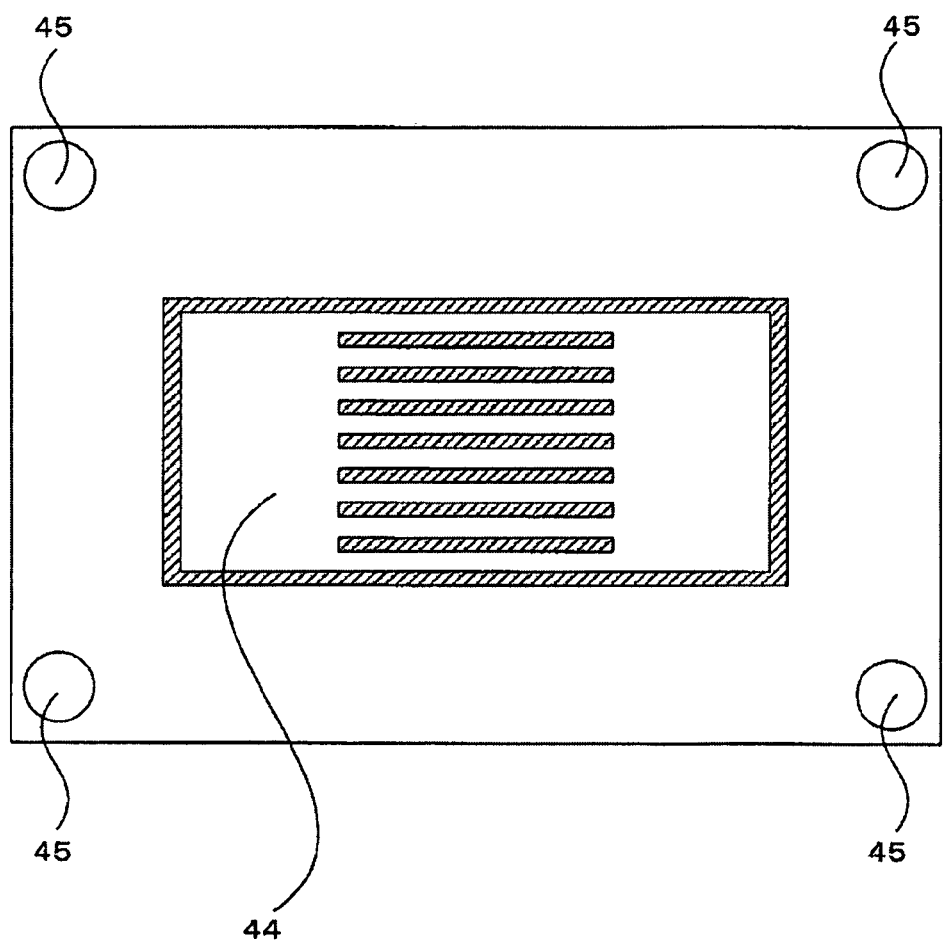
FIG. 7 is a B-B cross-sectional view showing a heat receiving portion 41 of the cooling device 300 shown in FIG. 6.

Next, a cooling device 300 according to a third embodiment of the present invention will be described with reference to FIG. 6. Comparing with the second embodiment, the third embodiment uses a heat receiving portion 41 in place of the heat receiving portion 8 and the chassis 33. The heat receiving portion 41, which serves both functions of the heat receiving portion 8 and the chassis 33, receives a liquid coolant through an inlet port 42 and discharges the same through an exit port 43. The interior of the heat receiving portion 41 will be described with reference to FIG. 7 showing the B-B cross section of FIG. 6. The heat receiving portion 41 has a flow passage 44 connected with the inlet port 42 and exit port 43, so that the liquid coolant flows through this. The heat receiving portion 41 further has through holes 45 at the four corners thereof, so that it is fixed to the board 2 by inserting spring loaded screws 3 through these through holes 45.

According to the third embodiment, the entire lower surface of the cooling device 300 functions as the heat receiving portion, which relaxes the restriction on positional relationship between the LSI 1 and the heat receiving portion 41, and hence facilitates the positioning of the board 2 during attachment thereof.

Figure 8:
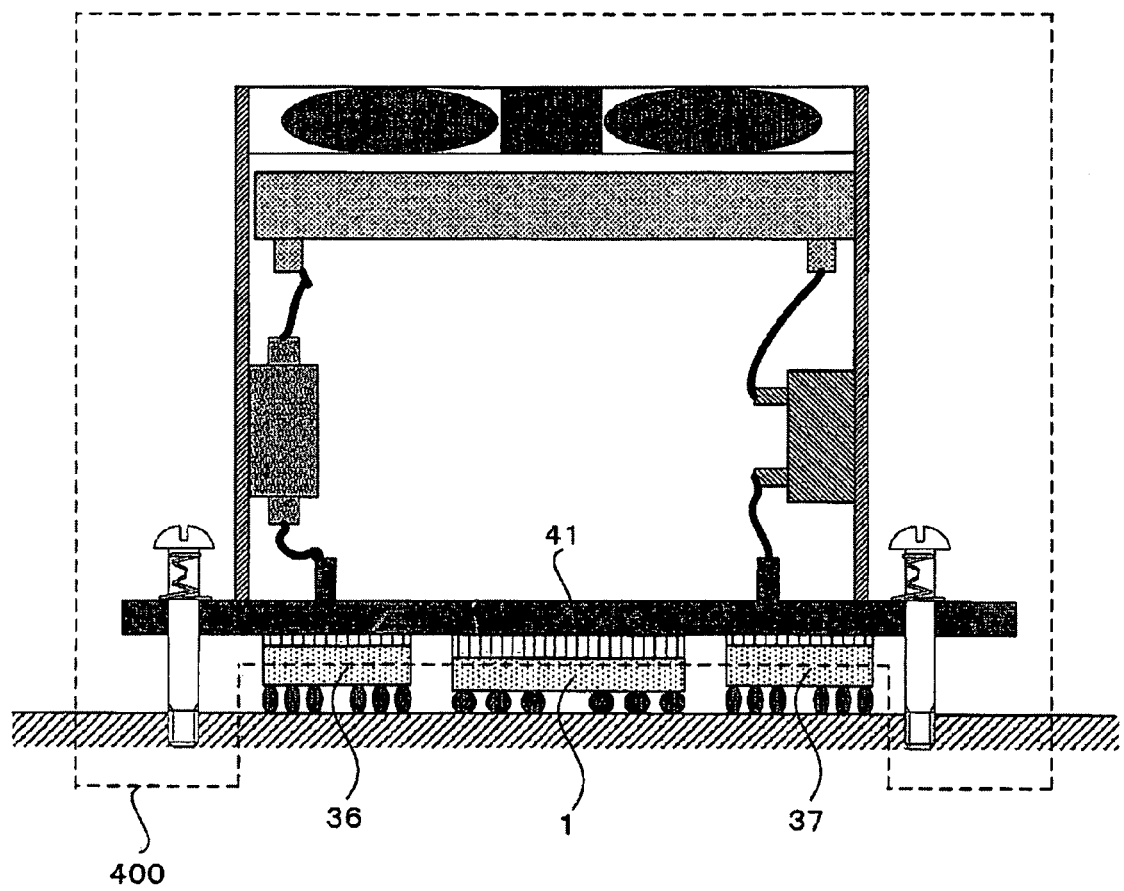
FIG. 8 is a cross-sectional view of a cooling device 400 according to a fourth embodiment of the present invention.

Next, a cooling device 400 according to a fourth embodiment of the present invention will be described with reference to FIG. 8. Comparing with the third embodiment, the fourth embodiment is different in that there are mounted, directly below the heat receiving portion 41, not only the LSI 1 but also electronic components 36 and 37. This makes it possible to collectively cool the plurality of electronic components.

Figure 9:
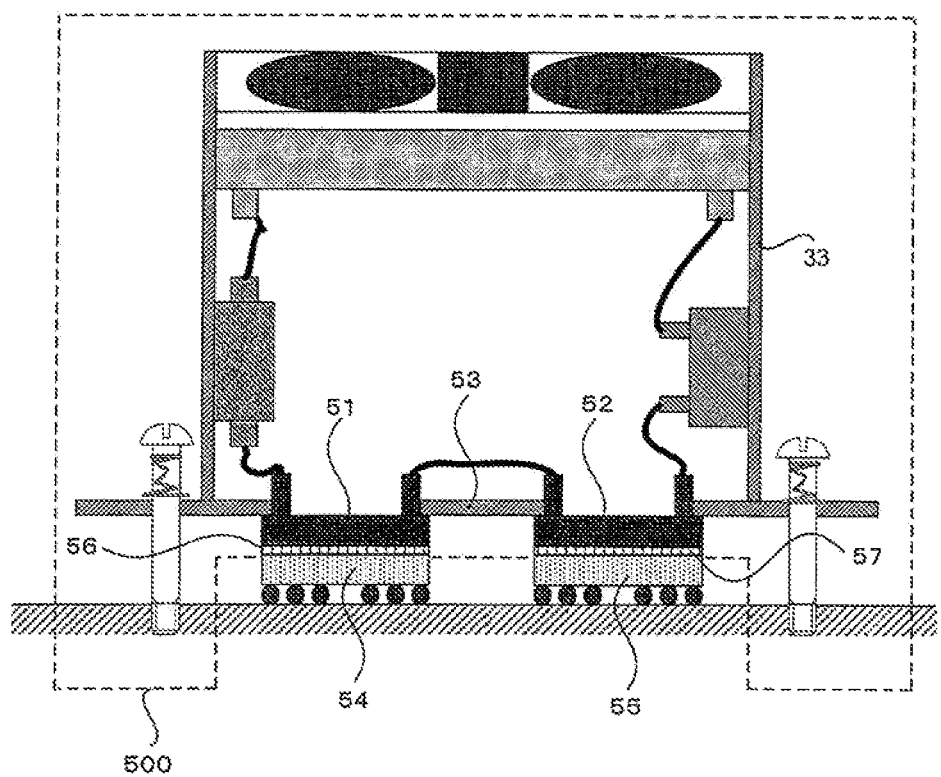
FIG. 9 is a cross-sectional view of a cooling device 500 according to a fifth embodiment of the present invention.

Next, a cooling device 500 according a fifth embodiment of the present invention will be described with reference to FIG. 9. Comparing with the first embodiment, the fifth embodiment is different in that two heat receiving portions 51 and 52 are provided; a base 53 having two openings for attachment of the two heat receiving portions 51 and 52 is used in place of the base 7 having an opening for attachment of the single heat receiving portion; and a chassis 33 having no ventilation holes in the side walls is used.

Electronic components 54 and 55 are mounted on the board 2. The electronic components 54 and 55 are for example electronic devices or electronic elements to be cooled. In the state in which the cooling device 500 is installed on the board 2, the heat receiving portion 51 is pressed against the electronic component 54 by the action of a pressing spring with a heat conductive material 56 interposed therebetween. The heat receiving portion 52 is pressed against the electronic component 55 with a heat conductive material 57 interposed therebetween. The heat receiving portions 51 and 52 may be connected either serially or in parallel in the closed-loop liquid coolant circulating system. According to the fifth embodiment, a plurality of electronic components can be cooled collectively.

Figure 10:
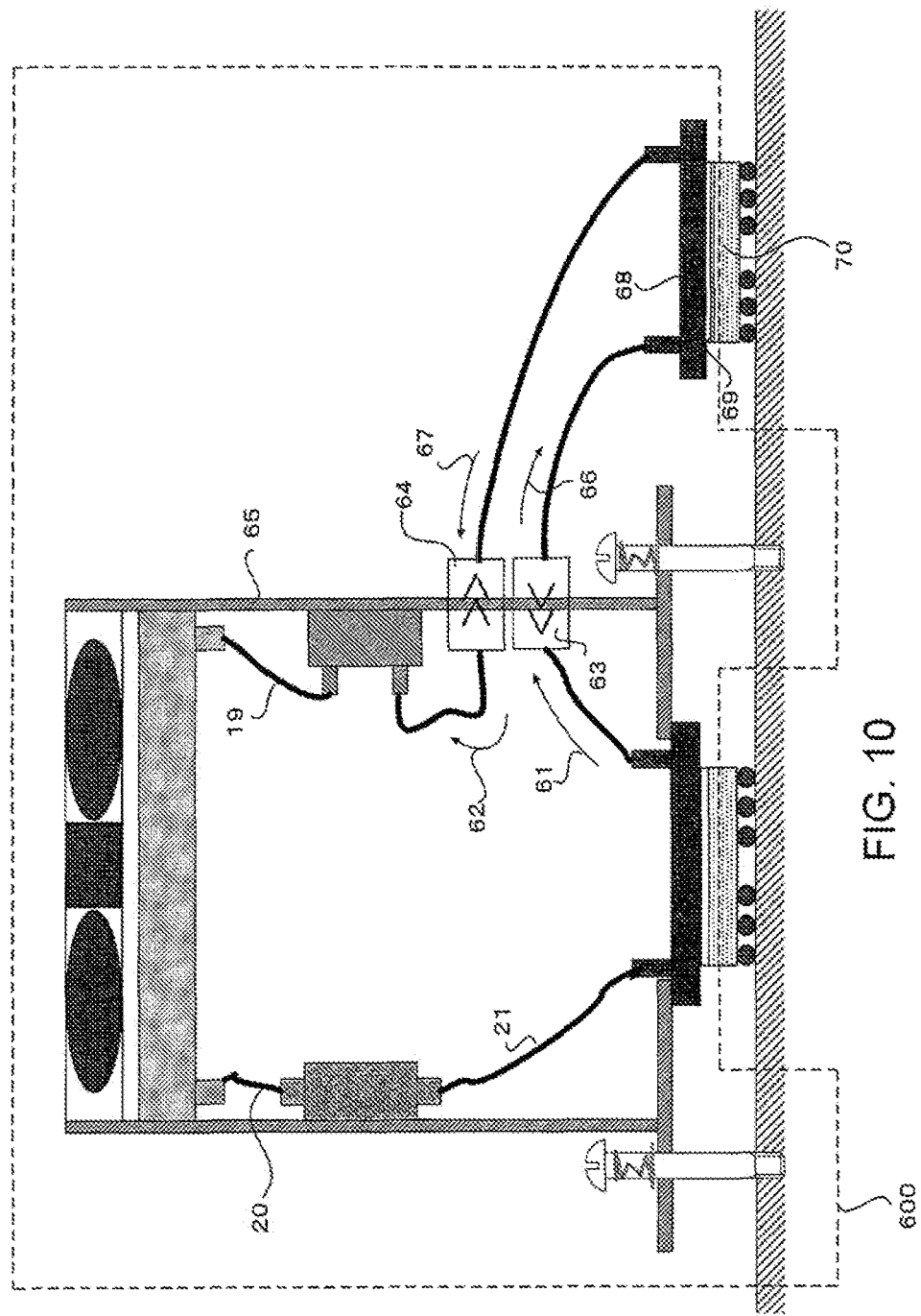
FIG. 10 is a cross-sectional view of a cooling device 600 according to a sixth embodiment of the present invention.

Next, a cooling device 600 according to a sixth embodiment of the present invention will be described with reference to FIG. 10. Comparing with the cooling device 300 described above, the cooling device 600 is different in the following points. In place of the hose 18, the cooling device 600 has a hose 61 one end of which is connected to the exit port 11 of the heat receiving portion 8, and a hose 62 one end of which is connected to the inlet port of the reserve tank 15. The cooling device 600 also has couplers 63 and 64 for connecting between the hoses. The other ends of the hoses 61 and 62 are connected to the couplers 63 and 64, respectively. In place of the chassis 33, the cooling device 600 uses a chassis 65 having through holes formed in its side walls for passing the couplers 63 and 64 therethrough. Each of the couplers 63 and 64 has one of hose attachment holes on the inner side of the chassis 65 and the other hose attachment hole on the outer side of the chassis 65. The cooling device 600 further has hoses 66 and 67 one ends of which are connected to the outer attachment holes of the couplers 63 and 64, respectively. The cooling device 600 further has a heat receiving portion 68 connected to the other ends of the hoses 66 and 67. The heat receiving portion 68 is joined to an electronic component 70 with a heat conductive adhesive agent 69.

There are arranged, above the heat receiving portion 8, a pump 14, a reserve tank 15, a radiator 16, a fan 17 and so on. In order to support the weight of these devices and to press the heat receiving portion 8 against the LSI 1 with a predetermined force, a spring loaded screw 3, a base 7 and so on are used to hold. In contrast, since there is no other device is arranged above the heat receiving portion 68, the electronic component 70 is held by adhesive bonding. Like the heat receiving portion 8, the heat receiving portion 68 may also be held by the spring loaded screws and the base.

Using the cooling device 600, not only the LSI 1 is cooled by the heat receiving portion 8, but also the electronic component 70 can be cooled by the heat receiving portion 68. The heat receiving portion 68 is detachable from the couplers 63 and 64. This provides an advantage that the cooling device 600 is easy to handle. The heat receiving portion 68 may be removed if unnecessary. In this case, a closed-loop circulating system is formed by connecting the exit port of the coupler 63 directly to the inlet of the coupler 64 by means of a hose. Further, if necessary, a coupler and a heat receiving portion may be added and connected serially or in parallel to the heat receiving portion 68 to form a closed-loop circulating system including three or more heat receiving portions.

Although the present invention has been described based on a few embodiments, the present invention is not limited to the foregoing embodiments, and obviously modifications and variations will occur to those skilled in the art.

For example, the description of the embodiments above has been made in terms of the case in which a computer LSI and its peripheral devices are to be cooled, the present invention is not limited to this, but may be applied to cooling of general electronic components or electronic equipment.

Further, although in the embodiments above the pump, the reserve tank, the radiator, and the fan are all attached to the base or chassis, some of them may be attached on the board, or on an inner wall of an apparatus (not shown) incorporating the LSI, the board and the cooling device.

Figure 11:
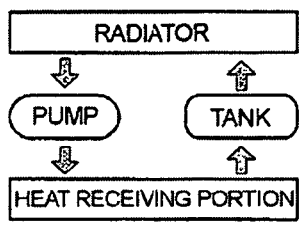
FIG. 11 is a diagram for explaining a route along which the liquid coolant flows through the closed-loop circulating system in the first to sixth embodiments.
Figure 12:
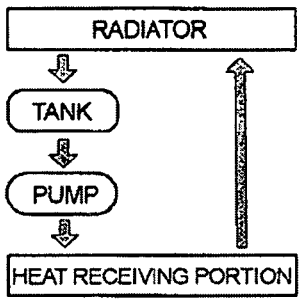
FIG. 12 is a diagram for explaining another route along which the liquid coolant flows through the closed-loop circulating system.
Figure 13:
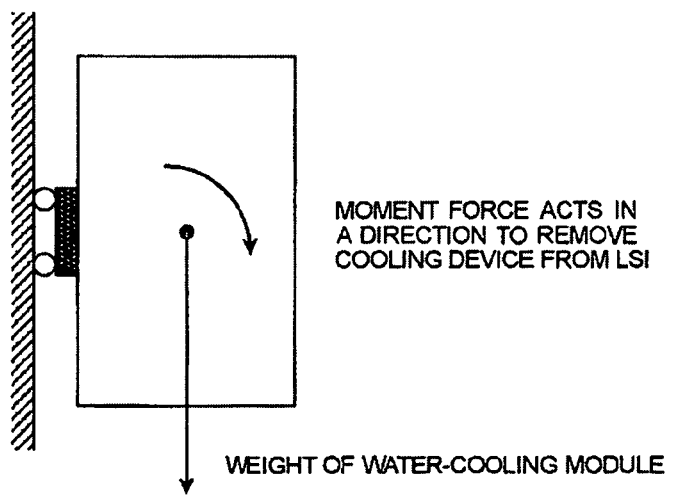
FIG. 13 is a diagram for explaining a moment force generated when a liquid-cooling module, is fixed to a heat generator mounted on a board which is set upright.

Still further, in the closed-loop liquid coolant circulating system according the embodiments described above, the liquid coolant is circulated, as shown in FIG. 11, in the sequence of the heat receiving portion, the reserve tank, the radiator, and the pump. However, the liquid coolant may be circulated, as shown in FIG. 12, in the sequence of the heat receiving portion, the radiator, the reserve tank, and the pump. The sequential relationship in the circulating system is determined as necessary in view of the mode of mounting, and temperature specifications of the components.

Further, although in the embodiments described above, a coil spring is used as the pressing spring; the present invention is not limited to this, but the base or the heat receiving portion may be biased by means of another elastic body. A rubber bush for example can be used as such a biasing member.

Still further, the embodiments described above are different from each other in whether the base or the chassis has ventilation holes or not and their positions if any, in number of heat receiving portions, in configuration of the heat receiving portion and the base, in direction of air flow generated by the fan, in number of electronic components to be cooled by one heat receiving portion, in whether couplers are provided or not, and in sequential relationship among the pump, the reserve tank, the heat receiving portion, and the radiator in the closed-loop liquid coolant circulating system. However, it will be obvious for those skilled in the art that these factors can be combined as necessary.

The invention claimed is:

1. A cooling device for cooling a device mounted on a board, wherein when the side of a surface of the board on which the device to be cooled is mounted is defined as the upper side while the side of the other surface is defined as the lower side in a substantially vertical direction to the board, the cooling device comprises:
a heat receiving portion that is arranged on the upper side of the device to be cooled for performing heat exchange with the device to be cooled and has a structure in which a liquid coolant passes through the inside thereof;
a columnar portion standing substantially perpendicularly on the board;
a base having a through hole which the columnar portion passes through, and arranged on the upper side of the heat receiving portion;
biasing means for biasing the base along the columnar portion to thereby press the heat receiving portion against the device to be cooled;
a group of circulating system devices forming a closed-loop liquid coolant circulating system together with the heat receiving portion, at least one of the group of circulating system devices being supported to the board by the base and the columnar portion;
a fan for generating air flow; and
a chassis for supporting the fan above the base such that the air flow is blown down to the board, or sucked up from the board.

2. The cooling device as claimed in claim 1, wherein the group of circulating system devices is fixed to the chassis.

3. The cooling device as claimed in claim 2, wherein:
the chassis has a cylindrical shape standing substantially perpendicularly on the base, the base being fixed to its lower opening, and the fan being fixed to is upper opening;
the group of circulating system devices includes a radiator, a pump and a reserve tank, the radiator being arranged within the cylinder below the fan, and the pump and the reserve tank being arranged on the inner surfaces of the cylinder below the radiator so as to face each other;
a space is formed between the pump and the reserve tank to provide a ventilation path which allows passage of the air flow; and
the air flow passes through the radiator and the ventilation path.

4. The cooling device as claimed in claim 1, wherein at least one of the base and the chassis has a ventilation hole for allowing passage of the air flow.

5. The cooling device as claimed in claim 1, comprising a base-integrated heat receiving portion in place of the heat receiving portion and the base, the base-integrated heat receiving portion having a through hole which the columnar portion passes through, and arranged on the upper side of the device to be cooled to perform heat exchange with the device to be cooled.

6. The cooling device as claimed in claim 1, wherein the device to be cooled by the cooling device is one of a plurality of devices to be cooled by the cooling device, the plurality of devices mounted on a board, wherein the heat receiving portion is arranged to face a the plurality of devices to be cooled.

7. The cooling device as claimed in claim 1, wherein the device to be cooled by the cooling device is one of a plurality of devices to be cooled by the cooling device comprising the heat receiving portion in plurality, each of the plurality of heat receiving portions being arranged to face at least one of the plurality of devices to be cooled.

8. The cooling device as claimed in claim 1, wherein: the devices in the group of closed-loop circulating system devices are connected to each other by means of attachable and detachable hoses to form the closed-loop circulating system; and
the group of closed-loop circulating system devices includes at least two couplers which are attachable to and detachable from the hoses at the opposite ends thereof.

9. The cooling device as claimed in claim 8, comprising at least one second heat receiving portion additionally provided to the closed-loop circulating system via the couplers, the second heat receiving portion being adhesively bonded to a second device to be cooled by means of a heat conductive adhesive agent.

10. A method for arranging, on a board, a cooling device for cooling a device mounted on the board, wherein when the side of a surface of the board on which the device to be cooled is mounted is defined as the upper side while the side of the other surface is defined as the lower side in a substantially vertical direction to the board, the method comprises the steps of:
supporting, on a base, a heat receiving portion and a group of circulating devices, the base having a through hole and arranged on the upper side of the heat receiving portion, the heat receiving portion having a structure in which a liquid coolant passes through the inside thereof, the group of circulating system devices forming a closed-loop liquid coolant circulating system together with the heat receiving portion;
arranging the heat receiving portion for performing heat exchange with the device to be cooled so as to face the device to be cooled; and
inserting an end of a columnar portion having biasing means fixed to the other end thereof through the through hole to fix the heat receiving portion to the board, whereby the heat receiving portion is pressed against the device to be cooled by the biasing means while the heat receiving portion is supported on the upper side of the board,
wherein a fan is supported above the base such that air flow generated by the fan is blown down to the board, or sucked up from the board.

11. A cooling device for cooling a device mounted on a board, wherein when the side of a surface of the board on which the device to be cooled is mounted is defined as the upper side while the side of the other surface is defined as the lower side in a substantially vertical direction to the board, the cooling device comprises:
a heat receiving portion that is arranged on the upper side of the device, has a structure in which a liquid coolant passes through the inside thereof, and is to be cooled for performing heat exchange with the device to be cooled;
a columnar portion standing substantially perpendicularly on the board;
a base having a through hole which the columnar portion passes through, and arranged on the upper side of the heat receiving portion;
biasing means for biasing the base along the columnar portion to thereby press the heat receiving portion against the device to be cooled;
a group of circulating system devices forming a closed-loop liquid coolant circulating system together with the heat receiving portion; and
a chassis for supporting the group of circulating system devices, wherein:
the chassis has a cylindrical shape standing substantially perpendicularly on the base, and the base being fixed to its lower opening;
the group of circulating system devices includes a radiator, a pump and a reserve tank, the radiator being arranged within the cylinder below the fan, and the pump and the reserve tank being arranged on the inner surfaces of the cylinder below the radiator so as to face each other;
a space is formed between the pump and the reserve tank to provide a ventilation path which allows passage of the air flow; and
the air flow passes through the radiator and the ventilation path.

12. The cooling device claimed in claim 11, further comprising a fan for generating air flow, wherein the chassis supports the fan above the base such that the air flow is blown down to the board, or sucked up from the board.

13. A cooling device for cooling a plurality of devices mounted on a board, wherein when the side of a surface of the board on which the plurality of devices to be cooled is mounted is defined as the upper side while the side of the other surface is defined as the lower side in a substantially vertical direction to the board, the cooling device comprises:
a plurality of heat receiving portions arranged on the upper side of the plurality of devices to be cooled for performing heat exchange with the device to be cooled, each of the plurality of heat receiving portions being arranged to face at least one of the plurality of devices to be cooled and corresponding to respective devices;
a columnar portion standing substantially perpendicularly on the board;
a base having a through hole which the columnar portion passes through, and arranged on the upper side of the plurality of heat receiving portions; and
biasing means for biasing the base along the columnar portion to thereby press the plurality of heat receiving portions against the plurality of devices to be cooled.

14. A cooling device for cooling a device mounted on a board, wherein when the side of a surface of the board on which the device to be cooled is mounted is defined as the upper side while the side of the other surface is defined as the lower side in a substantially vertical direction to the board, the cooling device comprises:
a heat receiving portion that is arranged on the upper side of the device to be cooled for performing heat exchange with the device to be cooled and has a structure in which a liquid coolant passes through the inside thereof;
a columnar portion standing substantially perpendicularly on the board;
a base having a through hole which the columnar portion passes through, and arranged on the upper side of the heat receiving portion;
biasing means for biasing the base along the columnar portion to thereby press the heat receiving portion against the device to be cooled;
a group of circulating system devices forming a closed-loop liquid coolant circulating system together with the heat receiving portion, at least one of the group of circulating system devices being supported to the board by the base and the columnar portion, the devices in the group of closed-loop circulating system devices being connected to each other by means of attachable and detachable hoses to form the closed-loop circulating system, the group of closed-loop circulating system devices including at least two couplers which are attachable to and detachable from the hoses at the opposite ends thereof; and at least one second heat receiving portion additionally provided to the closed-loop circulating system via the couplers, the second heat receiving portion being adhesively bonded to a second device to be cooled by means of a heat conductive adhesive agent.

* * * * *